United States Patent
Hung et al.

(10) Patent No.: US 7,061,805 B2
(45) Date of Patent: *Jun. 13, 2006

(54) P-CHANNEL NAND FLASH MEMORY AND OPERATING METHOD THEREOF

(75) Inventors: Chih-Wei Hung, Hsin-chu (TW); Cheng-Yuan Hsu, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/160,035

(22) Filed: Jun. 6, 2005

(65) Prior Publication Data

US 2006/0098486 A1    May 11, 2006

(30) Foreign Application Priority Data

Nov. 9, 2004  (TW) .............................. 93134067 A

(51) Int. Cl.
*G11C 16/04* (2006.01)
(52) U.S. Cl. .............................. 365/185.17; 365/185.33
(58) Field of Classification Search ........... 365/185.17, 365/185.33; 257/315
See application file for complete search history.

(56) References Cited

U.S. PATENT DOCUMENTS

2004/0057286 A1*  3/2004  Chen et al. ............ 365/185.17
2005/0087794 A1*  4/2005  Chen et al. ................. 257/315

OTHER PUBLICATIONS

Article titled "Novel Electron Injection Method Using Band-to-Band Tunneling Induced Hot Electron (BBHE) for Flash Memory with a P-channel Cell" jointly published by Ohnakado et al. in 1995. (4 pages).

* cited by examiner

Primary Examiner—Vu A. Le
(74) Attorney, Agent, or Firm—Jiang Chyun IP Office

(57) ABSTRACT

A p-channel NAND flash memory includes a plurality of memory cells in series connection between a p-type source region and a p-type drain region. Each memory cell includes a tunneling dielectric layer, a floating gate, and a control gate. An erase gate is formed between two adjacent memory cells, and a p-type doped region is formed in the substrate between two adjacent memory cells. A select transistor is formed between the p-type drain and the cell nearest to the p-type drain. The cells in the p-channel NAND flash memory is programmed by band-to-band tunneling induced hot carrier injection, and erased via F-N tunneling.

12 Claims, 2 Drawing Sheets

P-CHANNEL NAND FLASH MEMORY AND OPERATING METHOD THEREOF

CROSS-REFERENCE TO RELATED APPLICATION

This application claims the priority benefit of Taiwan application serial no. 93134067, filed on Nov. 9, 2004. All disclosure of the Taiwan application is incorporated herein by reference.

BACKGROUND OF THE INVENTION

1. Field of the Invention

The present invention relates to a semiconductor memory device, and more particularly to a p-channel NAND flash memory and operating method thereof.

2. Description of the Related Art

Flash memory devices are applicable for multiple operations of data writing, reading and erasing, and have the advantage that stored data will not been vanished even after power supply is cut off. Thus, flash memory devices are widely used as non-volatile memory devices for personal computers and other electronic facilities.

In a conventional flash memory device, doped polysilicon is used for fabricating floating gate and control gate. The control gate is formed directly on the floating gate, a dielectric layer is used to insulate the control gate from the floating gate, and a tunneling oxide layer is used to separate the floating gate from the substrate of the device; such device is commonly called stacked gate flash memory.

Flash memory devices can be categorized structurally as p-channel memory devices and n-channel memory devices. Wherein, the p-channel memory devices have certain features distinguishable from that of n-channel memory devices, such as high electron injection efficiency, high scalability, and low tunneling oxide electric filed. Furthermore, the p-channel memory devices can be used to avoid problems in device reliability induced by hot electron hole injection.

During a programming operation for a p-channel memory device, a method of channel hot electron injection (CHEI) or source-side injection (SSI) is usually used for injecting electrons into the floating gate. During an erasing operation, F-N tunneling is utilized to force all of the electrons distributed in the floating gate to pass the tunneling oxide into the substrate. For the CHEI, however, electron injection efficiency is low, and a relatively high operating voltage is required. For the SSI, on the other hand, the size of the devices will be continuingly miniaturized and the coupling capacity between gates of the devices will be reduced with enhancement of the integration of the devices; thus, during a programming operation, the vertical electric field between the control gate and the substrate will be insufficient and thus to slow down the progress of the programming operation.

On the other hand, flash memory arrays that are often used in the manufacturing industries include NOR (Not-OR) and NAND (Not-AND) arrays. The NAND array is higher in its integration comparing to NOR array, because cells in an NAND memory are in series connection. For an NAND array, however, the procedures of memory cells programming and data writing/erasing are more complicated. Conventionally, operations of memory cells programming and data erasing in an NAND array are carried out via F-N (Fowler-Nordheim) tunneling to cause electrons to pass through the tunneling oxide and enter into the floating gate, and further into the substrate, such that, during a high voltage operation, the tunneling oxide will sustain damages and reliability of which will be reduced. Moreover, since many memory cells are in series connection in the array, electric current of reading operation for memory cells becomes weaker, which will slow down the operation of the memory cells, and adversely affect the efficiency of the entire device.

SUMMARY OF THE INVENTION

In view of the above, the present invention is directed to provide a p-channel NAND (Not-AND) flash memory and operating method thereof, so as to speed up the programming operation, lower the operating voltage, and increase the efficiency of the memory cells.

The present invention is further directed to provide a p-channel NAND flash memory and operating method thereof, so as to enhance the integration and reliability of the memory cells.

In accordance with the above objects and other advantages of the present invention, the present invention provides a p-channel NAND flash memory containing a plurality of memory cell arrays. Each of the memory cell arrays includes: an n-type well, a plurality of stacked gate structures, a plurality of p-type doped regions, a plurality of erase gate, an insulator, a dielectric layer, a select gate, a select gate layer, a p-type drain region, and a p-type source region. The n-type well is formed in the substrate. Each of the stacked gate structures is disposed on the substrate, and, starting from the substrate, it is disposed at least the tunneling dielectric layer, the floating gate, the gate dielectric layer and the control gate. The p-type doped regions are formed between the stacked gate structures in the substrate, connecting the stacked gate structures in series. The erase gate is disposed between the stacked gate structures over the doped regions. The insulator is disposed between the stacked gate structures and the erase gate. The dielectric layer is disposed between the erase gate and the p-type doped regions. The select gate is disposed on the sidewall of one of the outermost of the stacked gate structures. The select gate dielectric layer is disposed between the select gate and the substrate. The p-type drain region is formed in the substrate on the side of the select gate opposite to the outermost stacked gate structure. The p-type source gate is formed in the substrate on one side of the other outermost stacked gate structure.

In the aforementioned p-channel NAND flash memory, the spaces between the stacked gate structures are filled up with the erase gate. The select gate dielectric layer is made of silicon oxide, for example. The inter-gate dielectric layer is made of, for example, silicon oxide-silicon nitride-silicon oxide. The floating gate is made of, for example, polysilicon doped with phosphoric ions, while the dielectric layer is made of, for example, silicon oxide.

In the aforementioned p-channel NAND flash memory, a plurality of memory cells is arranged in a two-dimensional array. In addition, the p-channel NAND flash memory further includes a plurality of word lines, a plurality of bit lines, a plurality of source lines, a plurality of select gate lines, and a plurality of erase gate lines. The bit lines are arranged in parallel along the column-direction, and are connected with the control gate of the stacked gate structures in the same column. The bit lines are arranged in parallel along the row-direction, and are respectively connected with the p-type drain region. The source lines are respectively connected with the p-type source region in the same column. The select gate lines are respectively connected with the select gate in the same column. The erase gate lines are arranged in parallel in the column-direction, and are connected with the erase gate in the same column. In the aforementioned p-channel NAND flash memory, two adjacent memory cells in the same rows share a p-type source region.

In the aforementioned p-channel NAND flash memory array, the erase gate is formed on the doped region (source/drain). Thus, the memory cells can draw electrons, via F-N tunneling during an erasing operation, from the floating gate into the erase gate for removal. In this manner of the erasing operation, the frequency for electrons passing through the tunneling dielectric layer can be lowered, and consequently lifetime of the tunneling dielectric layer can be extended, and reliability of the device can be enhanced.

In addition, in this invention every two adjacent stacked gate structures share one erase gate. Thus, increase in the size of the flash memory cells is not required, and accordingly, the integration of the device can be enhanced.

The present invention further provides an operating method of the p-channel flash memory suitable for a memory array containing a plurality of memory cell rows. Wherein, memory cells of each memory cell row are connected in series between a p-type source region and a drain region. Each of the memory cells contains a tunneling dielectric layer, a floating gate, and a control gate. An erase gate is disposed between every two adjacent memory cells, and a p-type doping region is disposed in the substrate between two adjacent memory cells. A select transistor is disposed between the p-type drain region and the memory cell nearest to the p-type drain region. A plurality of word lines are arranged in parallel along the column direction, and each of the word lines is connected to the control gate of the memory cells of the same column; a plurality of source lines are connected respectively to the p-type source region of the same column; a plurality of bit lines are arranged in parallel along the row direction, and each of the bit lines is connected with the drain region of the same row; a plurality of select gate lines are connected to the gate of the select transistor at the same column; and a plurality of erase gate lines are arranged in parallel along the column direction, and is connected with the erase gate of the same column.

The operating method of the p-channel NAND flash memory includes: during a programming operation, applying a first voltage on a selected bit line coupled with the memory cells; applying a second voltage on the select gate line; applying a third voltage on a selected word line coupled with the memory cells; and applying a forth voltage on the unselected word line, so as to program the memory cells via band-to-band tunneling induced hot electron injection. Here, the first voltage is about −3.3 V, the second voltage is about −10 V, the third voltage is about 10 V, and the fourth voltage is about −10 V.

The foregoing operating method of the p-channel NAND flash memory further includes: during a reading operation, applying a fifth voltage on a selected bit line coupled with the memory cell; applying a sixth voltage on the select gate line; applying a seventh voltage on a selected word line coupled with the memory cells; and applying a eighth voltage on the unselected word lines, for reading from the memory cells. Here, the fifth voltage is about −1 V, the sixth voltage is about −3.3 V, the seventh voltage is about −3.3 V, and the eighth voltage is about −10 V.

The foregoing operating method of the p-channel NAND flash memory further includes: during an erasing operation, applying a ninth voltage on the erase gate lines. Here, the ninth voltage is about 10 V. The difference between the ninth voltage and the voltage of the substrate is enough to cause electrons to enter into the memory cells from the floating gate to be removed when passing the erase gate, for erasing the entire memory cell array.

During the operations of NAND flash memory arrays according to this invention, band-to-band tunneling induced hot electron injection is utilized to cause electrons to pass through tunneling dielectric layer and enter into the floating gates, for programming operation of the memory cells; and F-N tunneling effect is utilized to cause electrons from the floating gates to pass through the inter-gate dielectric layer and enter into the erase gate, for erasing operation of the memory cells. Through the operations of this invention, since the frequency for electrons passing through the tunneling dielectric layer is lowered, the lifetime of the tunneling dielectric layer can be extended, and the reliability of the devices can be enhanced. In addition, since band-to-band tunneling induced hot electron injection, which has a high electron injecting efficiency, is utilized during the programming operation, amount of current in memory cells can be reduced, and thus the operating rate can be increased accordingly. Furthermore, since band-to-band tunneling induced hot electron injection and F-N tunneling effects are utilized during the programming and erasing operations, electricity usage is low, and thus power consumption of the entire memory device can be effectively reduced.

It is to be understood that both the foregoing general description and the following detailed description are exemplary, and are intended to provide further explanation of the invention as claimed.

DESCRIPTION OF THE PREFERRED EMBODIMENTS

Figure 1:
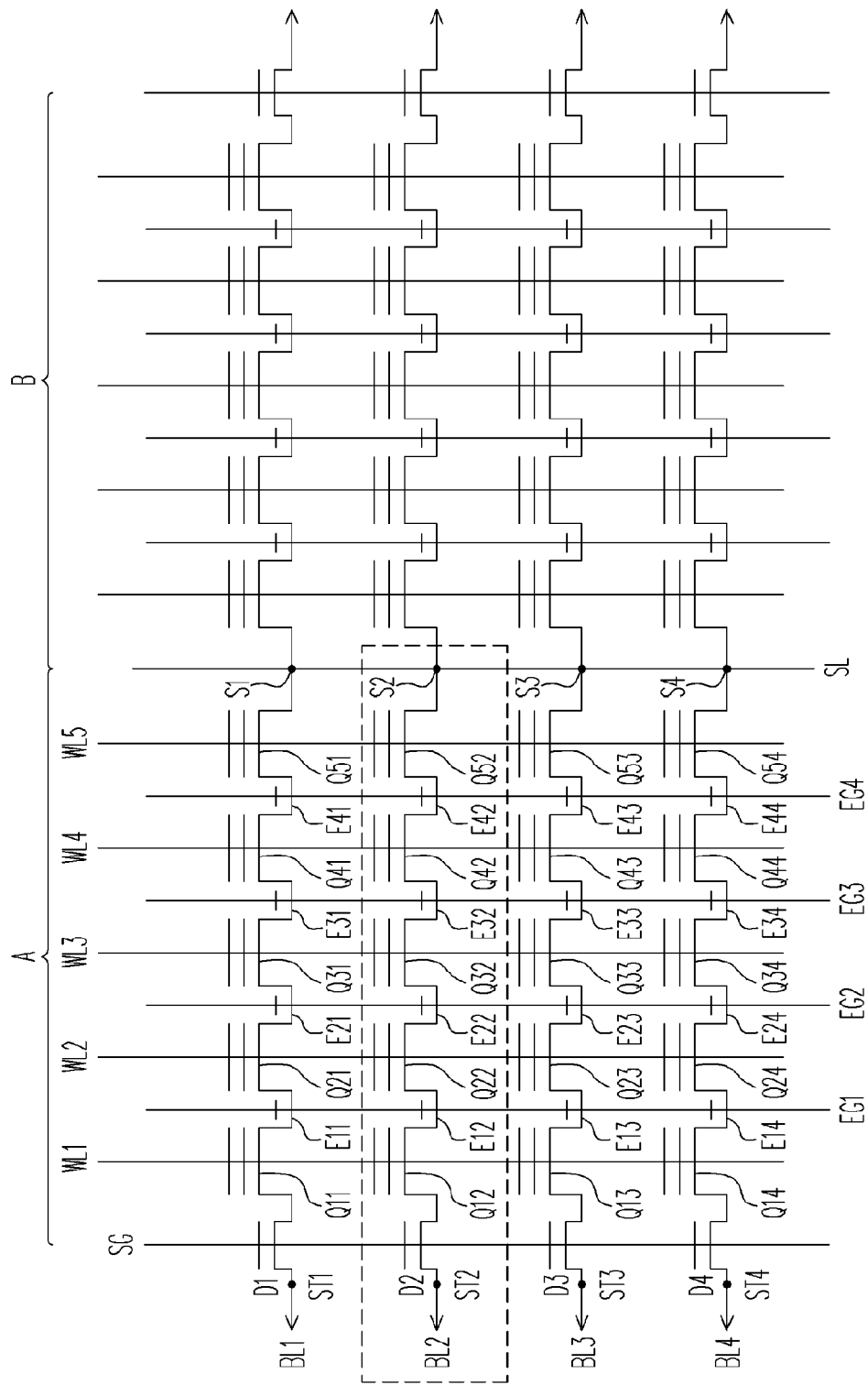
FIG. 1 is a circuit diagram showing a p-channel NAND flash memory cell array according to the present invention.

Reference will now be made in detail to the preferred embodiments of the invention. FIG. 1 is circuit diagram showing a p-channel NAND (Nor-AND gate) flash memory cell array. In this embodiment, a p-channel NAND memory cell array with four rows is illustrated as an example. In this invention, a one time programmable ROM contains memory array A and memory array B, wherein the memory arrays A and B share a source region (source line SL). Only memory array A is further described below since memory array B is structurally the same as memory array A.

Referring to FIG. 1, the p-channel NAND flash memory cell array contains a plurality of select transistors ST1~ST4, a plurality of memory cells Q1~D54, a plurality of word lines WL1~WL5, a select gate line SG, a plurality of bit lines BL1~BL4, and a plurality of erase gate lines EG1~EG4.

The select transistor ST1 and memory cells Q11~Q51 form a memory cell row in series connection between a drain region D1 and a source region S1, while the select transistor ST1 is disposed between the drain region D1 and the memory cell Q11. The select transistor ST2 and memory cells Q12~Q52 form a memory cell row in series connection between a drain region D2 and a source region S2, while the select transistor ST2 is disposed between the drain region D2 and the memory cell Q21. The select transistor ST3 and memory cells Q13~Q53 form a memory cell row in series connection between a drain region D3 and a source region S3, while the select transistor ST3 is disposed between the drain region D3 and the memory cell Q31. The select transistor ST4 and memory cells Q14~Q54 form a memory cell row in series connection between a drain region D4 and a source region S4, while the select transistor ST4 is disposed between the drain region D4 and the memory cell Q14.

A plurality of word lines are arranged in parallel along the column direction, and each of the word lines is connected to the control gate of the memory cells of the same column. In other words, control gates of the memory cells Q11~Q14 are coupled to the corresponding word line WL1; control gates of the memory cells Q21~Q24 are coupled to the corresponding word line WL2; control gates of the memory cells Q31~Q34 are coupled to the corresponding word line WL3; control gates of the memory cells Q41~Q44 are coupled to the corresponding word line WL4; and control gates of the memory cells Q51~Q54 are coupled to the corresponding word line WL5.

Gates of the select transistors ST1~ST4 are coupled to the select gate line SG. A plurality of bit lines are arranged in parallel along the row direction, and each of the bit lines is connected with the drain region of the same row, i.e., the drain regions D1~D4 are connected respectively to the bit lines BL1~BL4. The source line is connected with the source regions in the same column, i.e., the source regions S1~S4 of each memory column are connected to the source line SL.

An erase gate is disposed between two adjacent memory cells on the same row. In other words, erase gates E11~E41 are formed respectively between the memory cells Q11~Q51; erase gates E12~E42 are formed respectively between the memory cells Q12~Q52; erase gates E12~E42 are formed respectively between the memory cells Q12~Q52; and erase gates E14~E44 are formed respectively between the memory cells Q14~Q54.

A plurality of erasing lines are arranged in parallel along the column direction, and each of the erasing lines is connected to the erase gate in the same column. In other words, erase gates E11~E14 are coupled to the corresponding erase gate line EG1; erase gates E21~E24 are coupled to the corresponding erase gate line EG2; erase gates E31~E34 are coupled to the corresponding erase gate line EG3; and erase gates E41~E44 are coupled to the corresponding erase gate line EG4.

Next, referring to both FIG. 1 and Table 1, operation modes of p-channel NAND flash memory arrays of the present invention are described below, which include operation modes for programming, erasing, and data reading. The memory cell Q22 as shown in FIG. 1 is taken as an example in the following description.

When programming operation is performed upon the memory cell Q22, a bias voltage Vgp (e.g., about 10 V) is applied on the selected word line WL2. A bias voltage Vg (e.g., about −10 V) is applied on other unselected word lines WL1, WL3, WL4 and WL5, for turning on the channel of the unselected memory cells. A bias voltage Vslp (e.g., −3.3 V) is applied on the select gate line SG (while a bias voltage of about 0 V is applied on the other unselected select gate line SG) for turning on the channel of the select transistors ST1~ST4, and connecting electrically the bit lines BL1~BL4 with memory cells Q1~Q51, Q12~Q52, Q13~Q53, and Q14~Q54, respectively. A bias voltage of about 0 V is applied on the unselected bit lines BL1, BL3, and BL4, while a bias voltage Vdp(e.g., about −6 V) is applied on the selected bit line BL2. The source line SL is floating. A bias voltage of 0 V is applied on the erase gate lines EG1–EG4. Under such bias voltages, band-to-band tunneling induced hot electron injection can be induced near the drain region under the floating gate of the memory cell Q22, and thus hot electrons can be drew into the floating gate.

During the aforementioned programming operation, the memory cells Q21, Q23 and Q24, which share the word line WL2, will not be programmed. This is because that a bias voltage of 0 V is applied on the unselected bit lines BL1, BL3 and BL4, which will not induce band-to-band tunneling hot electron injection, and thus not cause the memory cells Q21, Q23 and Q24 to be programmed.

In addition, when a bias voltage of −10 V is applied on the unselected word lines WL1, WL3 and WL4, the voltage is used merely to turn on the channel of the memory, and is not enough to induce band-to-band tunneling hot electron injection. Thus, the memory cells Q11~Q14, Q31~Q34, Q41~Q44 and Q51~Q54, which are connected with the unselected word lines WL1, WL3 and WL4, will not be programmed.

In the above description of the programming operation, a single memory cell of a memory cell array is taken as an example. However, the programming operation of the NAND flash memory cell array of this invention can also be carried out under the control of each word line, select gate line and bit line, in a unit of bit set, section or region.

When data is read from the memory cell Q22, a bias voltage Vslr (e.g., −3.3 V) is applied on the select gate line SG, while 0 V is applied on the unselected select gate lines, for turning on channel of the select transistors ST1~ST4, and connecting electrically the bit lines BL1~BL4 with the memory cells Q11~Q14, respectively. A bias voltage Vdr (e.g., about −1 V) is applied on the bit line BL2, while a voltage of 0 V is applied on the unselected bit line BL2. A bias voltage Vgr (e.g., about −3.3 V) is applied on the selected word line WL2, and a bias voltage (e.g., about −10 V) is applied on other unselected word lines WL1, WL3 and WL4, for turning on channels of the memory cells. A bias voltage of 0 V is applied on the erase gate lines EG1~EG3. Under such circumstances, the channel of the memory cell of the floating gate carrying electric charges is turned off and the current therein is very weak, while the channel of the memory cell of the floating gate carrying no electric charges is turned on and the current therein is strong. Thus, the status of whether the channel of the memory cell is turned on and the amount of the current therein can be used for determining whether the digital data stored in the memory cell is 1 or 0.

In the above description of the reading operation, a single memory cell of a memory cell array is taken as an example. However, the reading operation of the NAND flash memory cell array of this invention can also be carried out under the control of each word line, select gate line and bit line, for reading data in a unit of bit set, section or region.

Next, an erasing method of an NAND flash memory cell row of this invention is described in the following. Here, as shown in Table 1, an erasing operation on the entire NAND flash memory cell row is taken as an example for the illustration.

TABLE 1

| | Programming | Erasing | Reading |
|---|---|---|---|
| Selected word line WL2 | Vgp (10 V) | 0 | Vgr (−3.3 V) |

TABLE 1-continued

|  | Programming | Erasing | Reading |
|---|---|---|---|
| Unselected word lines WL1, WL3, WL4, WL5 | Vg (−10 V) | 0 | Vg (−10 V) |
| Selected bit line BL2 | Vdp (−6 V) | 0 | Vdr (−1 V) |
| unselected bit lines BL1, BL3, BL4 | 0 | 0 | 0 |
| Select gate line SG | Vsp (−3.3 V) | 0 | Vslr (−3.3 V) |
| Unselected select gate line SG | 0 | 0 | 0 |
| Source line SL | floating | floating | 0 |
| Erase gate lines EG1, EG2, EG3 | 0 | Vge (10 V) | 0 |

During an erasing operation on a memory cell, a bias voltage Vge (e.g., about 10 V) is applied on all gate lines EG1 to EG4. The source line SL, word lines WL1~WL5, bit lines BL1~BL4, and select gate line SL are floating. Therefore, the voltage applied between the erase gate and the floating gates is sufficient to create large electric field between the erase gate and the floating gates, so as to cause electrons, via F-N tunneling, from the floating gates to pass through the inter-gate dielectric layer (i.e., the dielectric layer between the erase gate and the floating gates) and enter into the erase gate for removal.

In the above description of the erasing method, the erasing operation on the entire NAND flash memory cell row is taken as an example. However, the erasing operation of the NAND flash memory cell array of this invention can also be carried out under the control of erase gate lines, for erasing data in a unit of section or region. For example, if a bias voltage Vge is selectively applied on the erase gate line EG1, only data stored in the memory cells Q11~Q14 and Q21~Q24 will be erased. I.e., one erase gate line is used to erase data in two columns of memory cells.

Therefore, during the operations of NAND flash memory arrays according to this invention, band-to-band tunneling induced hot electron injection is utilized to cause electrons to pass through tunneling dielectric layer and enter into the floating gates, for programming operation of the memory cells; and F-N tunneling effect is utilized to cause electrons from the floating gates to pass through the inter-gate dielectric layer and enter into the erase gate, for erasing operation of the memory cells. Through the operations of this invention, since the frequency for electrons passing through the tunneling dielectric layer is lowered, the lifetime of the tunneling dielectric layer can be extended, and the reliability of the devices can be enhanced. In addition, since band-to-band tunneling induced hot electron injection, which has a high electron injecting efficiency, is utilized during the programming operation, amount of current in memory cells can be reduced, and thus the operating rate can be increased accordingly. Furthermore, since band-to-band tunneling induced hot electron injection and F-N tunneling effects are utilized during the programming and erasing operations, electricity usage is low, and thus power consumption of the entire memory device can be effectively reduced.

Figure 2:
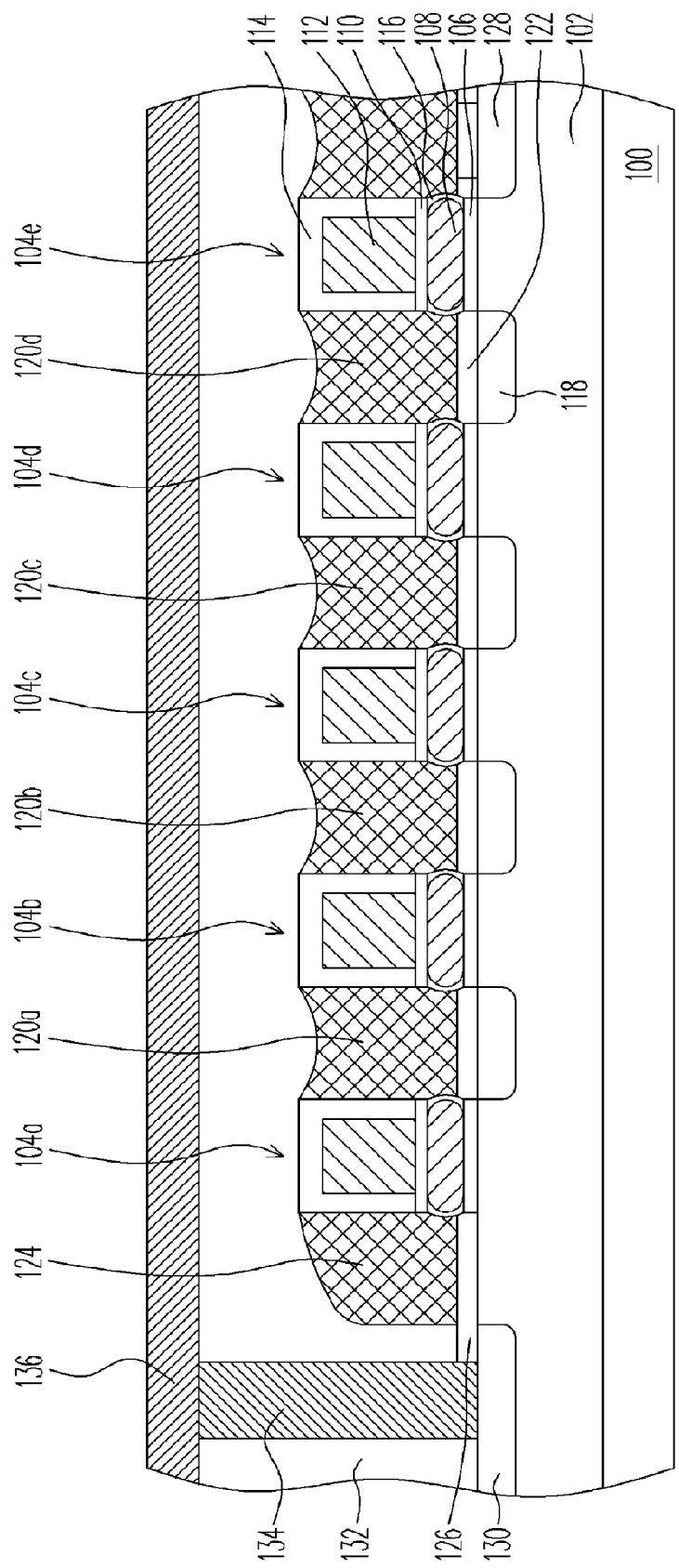
FIG. 2 is a sectional view showing structure of a p-channel NAND flash memory according to the present invention.

Next, the structure of p-channel NAND flash memory cell arrays of the present invention is described as follows. FIG. 2 is a sectional view of a structure of the p-channel flash memory according to this invention, wherein one memory cell row has five memory cells. Here, one memory cell row is used for the description.

Referring to FIG. 2, the structure of the NAND flash memory of this invention contains at least: substrate 100, n-type well region 102, a plurality of stacked gate structure 104a~104e (each of which including tunneling dielectric layer 106, floating gate 108, inter-gate dielectric layer 110, control gate 112, insulator 114 and insulator 116), p-type doped region (source/drain region) 118, a plurality of erase gates 120a~120d, dielectric layer 122, select gate 124, select gate dielectric layer 126, p-type source region 128, p-type drain region 130, inter-layer dielectric layer 132, plug 134, and bit line 136.

The substrate 100 is, for example, a silicon substrate. An n-type well 102, for example, is disposed in the substrate 100. A plurality of stacked gate structures 104a~104e are disposed on the substrate 100. Each of the stacked gate structures 104a~104e contains, starting from the substrate 100, tunneling dielectric layer 106, floating gate 108, inter-gate dielectric layer 110, and control gate 112. The insulator 114 is disposed, for example, on the top and the sidewalls of the control gate 112. The inter-gate dielectric layer 110 is made of silicon oxide-silicon nitride-silicon oxide, for example. The floating gate 108 is made of, for example, poly-silicon doped with phosphoric. The control gate 112 is made of, for example, doped poly-silicon.

Each of the doping regions (source/drain regions) 118 is disposed in the substrate 100 between two of adjacent stacked gate structures 104a~104e, so that the stacked gate structures 104a~104e are connected in series.

The dielectric layer 122 is disposed on the doping regions (source/drain regions) 118, i.e., between the stacked gate structures 104a~104e above the substrate 110. The dielectric layer 122 is made of silicon oxide, for example.

The erase gates 120a~120d are, for example, disposed between the stacked gate structures 104a~104e and above the doping regions (source/drain regions) 118. Wherein, the spaces between the stacked gate structures 104a~104e are filled up with the erase gates 120a~120d. The dielectric layer 122 is disposed between the erase gates 120a~120d and the doping regions (source/drain regions) 118. The insulator 114 and the insulator 116 are disposed between the erase gates 120a~120d and the stacked gate structures 104a~104e.

The select gate 124 is disposed on the sidewall of the outermost stacked gate structure 104a. The select gate dielectric layer 126 is disposed between the select gate 124 and the substrate 100, and is made of silicon oxide, for example.

The source region 128 is disposed in the substrate 100 next to the outermost stacked gate structure 104e. The drain region 130 is disposed in the substrate 100 on the side of the select gate 124 opposite to the stacked gate structure 104a.

The inter-layer dielectric layer 132 is disposed on the substrate 100. The bit line 136 is disposed on the inter-layer dielectric layer 132, and is electrically connected with the drain region 130 through the plug 134.

In the above-mentioned p-channel NAND flash memory cell array, the erase gates 120a~120d are disposed on the doping regions (source/drain regions) 118. Thus, during an erasing operation of the memory cell, electrons can be drawn, via F-N tunneling, from the floating gate into the erase gates 120a~120d for removal. In this way, the frequency for electrons passing through the tunneling dielectric layer can be reduced, and thus, lifetime of the tunneling dielectric layer can be extended and reliability of the device can be enhanced.

Furthermore, each two adjacent stacked gate structures share one erase gate, and hence, increase in the size of the flash memory cells is not required, and integration of the device can be enhanced accordingly.

In the aforementioned embodiment, five memory cells in series connection are taken as an example for the illustration. In this invention, of course, the number of the series memory cells can be different based on actual needs. For example, 32 to 64 of memory cells can be connected in series on a single bit line.

Based on the foregoing, during the operations of NAND flash memory arrays according to this invention, band-to-band tunneling induced hot electron injection is utilized to cause electrons to pass through tunneling dielectric layer and enter into the floating gates, for programming operation of the memory cells; and F-N tunneling effect is utilized to cause electrons from the floating gates to pass through the inter-gate dielectric layer and enter into the erase gate, for erasing operation of the memory cells. Through the operations of this invention, since the frequency for electrons passing through the tunneling dielectric layer is lowered, the lifetime of the tunneling dielectric layer can be extended, and the reliability of the devices can be enhanced.

In addition, since band-to-band tunneling induced hot electron injection, which has a high electron injecting efficiency, is utilized during the programming operation, amount of current in memory cells can be reduced, and thus the operating rate can be increased accordingly. Furthermore, since band-to-band tunneling induced hot electron injection and F-N tunneling effects are utilized during the programming and erasing operations, electricity usage is low, and thus power consumption of the entire memory device can be effectively reduced.

Furthermore, each two adjacent stacked gate structures share one erase gate, and hence, increase in size of the flash memory cells will be avoided, and integration of the device can be enhanced accordingly.

It will be apparent to those skilled in the art that various modifications and variations can be made to the structure and method of the present invention without departing from the scope or spirit of the invention. In view of the foregoing, it is intended that the present invention covers modifications and variations of this invention provided they fall within the scope of the following claims and their equivalents.

What is claimed is:

1. A operating method of a p-type channel NAND flash memory, applicable for a memory cell array of a plurality of memory cell arrays, wherein the memory cells in each of the memory cell rows are connected in series between a p-type source region and a p-type drain region; each of the memory cells comprises a tunneling dielectric layer, a floating gate, and a control gate, while an erase gate is disposed between each of the two adjacent memory cells, and a p-type doping region is disposed under the erase gate, a select transistor is disposed between the p-type drain region and the memory cell nearest to the p-type drain region; a plurality of word lines are arranged in parallel as columns, and connected respectively to the control gates of the memory cells of each column; a plurality of source lines are connected respectively to the p-type source regions of each column; a plurality of bit lines are arranged in parallel as rows, and connected respectively to the p-type drain regions of each row; a plurality of select gate lines are connected respectively to the select transistors of each column; a plurality or erase gate lines are arranged in parallel as columns, and connected respectively to the erase gates of each column, the operating method comprising:

during a programming operation, applying a first voltage to a selected bit line; applying a second voltage to the select gate line; applying a third voltage to a selected word line; and applying a forth voltage to unselected word lines, so as to program a selected memory cell via band-to-band tunneling induced hot electron injection.

2. The operating method according to claim 1, wherein the first voltage is about −6 V.

3. The operating method according to claim 1, wherein the second voltage is about −3.3 V.

4. The operating method according to claim 1, wherein the third voltage is about 10 V.

5. The operating method according to claim 1, wherein the fourth voltage is about −10 V.

6. The operating method according to claim 1, further comprising:

during a reading operation, applying a fifth voltage to a selected bit line; applying a sixth voltage to the select gate line; applying a seventh voltage to a selected word line; and applying a eighth voltage to unselected word lines to read the selected cell.

7. The operating method according to claim 6, wherein the fifth voltage is about −1 V.

8. The operating method according to claim 6, wherein the sixth voltage is about −3.3 V.

9. The operating method according to claim 6, wherein the seventh voltage is about −3.3 V.

10. The operating method according to claim 6, wherein the eighth voltage is about −10 V.

11. The operating method according to claim 1, further comprising:

during an erasing operation, applying a ninth voltage to the erase gate lines, wherein difference between the ninth voltage and a voltage of the substrate is enough to pull electrons out of the floating gate and inject into the erase gate, so as to erase the entire memory cell array.

12. The operating method according to claim 11, wherein the ninth voltage is about 10 V.

* * * * *